(12) United States Patent
Matienzo et al.

(10) Patent No.: US 6,284,329 B1
(45) Date of Patent: Sep. 4, 2001

(54) METHOD OF FORMING ADHERENT METAL COMPONENTS ON A POLYIMIDE SUBSTRATE

(75) Inventors: Luis J. Matienzo, Endicott; Kim J. Blackwell, Owego; Frank D. Egitto, Binghamton; Allan R. Knoll, Endicott, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/376,901

(22) Filed: Aug. 18, 1999

Related U.S. Application Data

(62) Division of application No. 08/837,859, filed on Apr. 22, 1997, now Pat. No. 6,194,076.

(51) Int. Cl.[7] ............... C23C 14/02; C23C 14/20; C23C 14/24; C23C 14/38; B05D 3/06
(52) U.S. Cl. ............... 427/537; 427/539; 427/528; 427/531; 427/250; 204/192.17
(58) Field of Search ............... 427/536, 537, 427/539, 566, 250, 533, 525, 531; 428/458, 473.5; 204/192.17

(56) References Cited

U.S. PATENT DOCUMENTS

| | | | |
|---|---|---|---|
| 3,686,018 | * 8/1972 | Lindblom et al. | 427/539 |
| 4,382,101 | * 5/1983 | Polak | 427/539 |
| 4,544,571 | 10/1985 | Miller . | |
| 4,886,681 | * 12/1989 | Clabes et al. | 427/533 |
| 6,171,714 | * 1/2001 | Bergkessel et al. | 427/537 |

FOREIGN PATENT DOCUMENTS

| | | |
|---|---|---|
| 13-21687 | 12/1989 | (JP) . |
| 32-17823 | 9/1991 | (JP) . |

OTHER PUBLICATIONS

Japan Application No. 62–089478, to Matsushita Electric Ind. Co., published on Oct. 21, 1988 JP 63255362.
Japan Application No. 3–298023, to Shin ETSU Chem. Co. LTD, published on Apr. 30, 1993.
Japan Application 4–076753, to Dainippon Printing Co. LTD, published on Oct. 29, 1993.
Japan Application 06–331282, to Murata MFG. Co. LTD, published Jun. 21, 1996.

* cited by examiner

Primary Examiner—Marianne Padgett
(74) Attorney, Agent, or Firm—William N. Hogg

(57) ABSTRACT

A method for attaching adherent metal components, particularly a copper film, on at least one surface of a polyimide substrate is provided. The method comprises the steps of: exposing at least one surface of the polyimide substrate to a reactive gas plasma that provides a level of ion bombardment of the polyimide surface sufficient to disrupt at least a portion of the imide groups on the surface and to form reactive carboxylate groups, carbonyl groups and other carbon-oxygen functional groups on the surface; and then depositing a metal film onto the chemically-modified surface without intervening exposure to air. The present invention also provides a copper-coated polyimide product comprising a polyimide substrate having a substantially smooth and chemically-modified surface and a copper film directly attached to the surface, i.e., the product is free of a polymeric adhesive layer or tie coat between the surface of the polyimide substrate and the copper film.

15 Claims, 1 Drawing Sheet

Adhesion vs Degree of Ion Bombardment

$\tau = q\, n_+ \varphi_f \div p$ (eV/ liter-atm x $10^{17}$)

Horizontal line indicates value of peel strength with no plasma treatment.

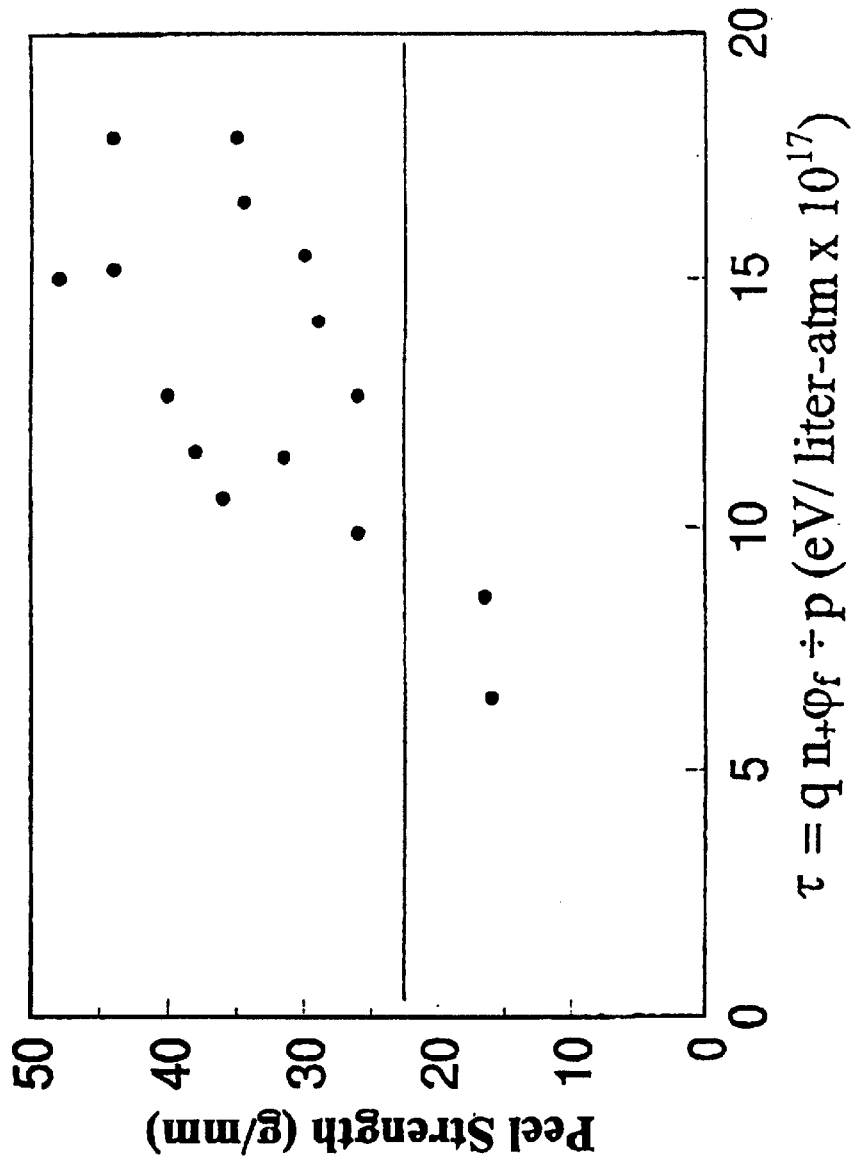
FIGURE
$\tau = q\, n_+ \phi_f \div p$ (eV/ liter-atm x $10^{17}$)
Horizontal line indicates value of peel strength with no plasma treatment.

METHOD OF FORMING ADHERENT METAL COMPONENTS ON A POLYIMIDE SUBSTRATE

CROSS REFERENCE TO RELATED APPLICATION

This application is a divisional of application Ser. No. 08/837,859, filed Apr. 22, 1997 now U.S. Pat. No. 6,194,076.

FIELD OF THE INVENTION

This invention relates generally to an improved method of forming adherent metal components on a polyimide substrate. More particularly, this invention relates to a method of attaching an adherent copper layer to the surface of a polyimide substrate without using a polymeric adhesive layer or a tie coat to enhance adhesion between the polyimide and the copper.

BACKGROUND OF THE INVENTION

Polyimide substrates having copper components in the form of films, coatings, lines, and pads attached to a least one surface thereof are widely used in the microelectronics industry. For example, such polyimide substrates are used in polyimide flexible circuits, printed circuit boards, and chip carriers. In another application, polyimide substrates having a copper film attached to at least one surface thereof are used to form photocells. In many of these applications, the resulting products are subjected to adverse environmental conditions that promote detachment of the copper component from the surface of the polyimide substrate. For example, the products may be subjected to environmental testing at high heat and humidity or used in outdoor service. Thus, a number of procedures have been developed to improve the adhesion of copper components to polyimide substrates.

For example, in forming circuitized polyimide substrates, a layer of chromium or titanium is first deposited onto the polyimide substrate to form a tie coat. Then a copper layer is deposited onto the tie coat, typically by a vapor deposition process such as sputtering or evaporation. The thickness of the copper layer can be increased by electroplating of copper onto the vapor-deposited layer. Thereafter, portions of the copper layer are removed by etching to form the desired circuit pattern. Unfortunately, it is also necessary to remove the tie coat by a second etch step. This second etch step is time-consuming and adds to the cost of forming the circuitized product. In addition, the waste that results from this second etch step is environmentally undesirable. Thus, additional care and cost is required to handle the waste.

Attempts have also been made to improve adhesion between copper components and polymer substrates, such as polyimide substrates, by mechanically or chemically roughening the surface of the substrate prior to deposition of a copper thereon. It is believed that the roughening improves adhesion of the copper to the polymer by mechanical interlocking. Unfortunately, such adhesion is not very durable especially when the copper-coated polymeric product is subjected to the high humidity and temperature of stress testing.

Finally, attempts have also been made to enhance adhesion by employing a polymeric adhesive layer between the copper component and the polyimide substrate. However, removal of the adhesive in selected areas of the resulting product can pose problems.

Accordingly, it is desirable to have a new method for forming adherent metal components, particularly copper components, on a polyimide substrate.

SUMMARY OF THE INVENTION

In accordance with the present invention, a method for attaching adherent metal components, particularly a copper film, on at least one surface of a polyimide substrate is provided. The method comprises the steps of: exposing at least one surface of the polyimide substrate to a reactive gas plasma that provides a level of ion bombardment of the polyimide surface sufficient to disrupt at least a portion of the imide groups on the surface and to form reactive carboxylate groups, carbonyl groups and other carbon-oxygen functional groups on the surface; and then depositing a metal film onto the chemically-modified surface without intervening exposure to air. The level of ion bombardment used to chemically modify the surface results from plasma conditions such that the expression $(q) \times (n_+) \times (\phi_f)/p$ has a value of at least about $5 \times 10^{17}$ eV/liter-atm; where $q$=the unit electronic charge (equal to 1 for units of eV/liter-atm);

$n_+$=the number density of positive ions in the plasma (liter$^{-1}$);

$(\phi_f)$=the potential difference between the plasma and the polyimide surface (volts); and p=pressure in atmospheres.

The present invention also provides a copper-coated polyimide product comprising a polyimide substrate having a substantially smooth and chemically-modified surface and a copper film directly attached to the surface, i.e., the product is free of a polymeric adhesive layer or tie coat between the surface of the polyimide substrate and the copper film.

BRIEF DESCRIPTION OF THE DRAWINGS

The sole FIGURE is a graph in which the level ion bombardment to which various polyimide substrates were exposed is plotted against the adhesion of the metal layers that were deposited on the surface of the ion-bombarded substrates.

DETAILED DESCRIPTION OF THE INVENTION

In accordance with the present invention, a method of attaching an adherent metal component, preferably a conductive metal film, on at least one surface of a polyimide substrate is provided. The method comprises the steps of: exposing at least one surface of the polyimide substrate to a reactive gas plasma that provides a level of ion bombardment of the polyimide surface sufficient to cross-link a portion of the polyimide on the surface, to disrupt a portion of the imide groups on the surface, and to provide reactive carboxylate groups on the surface; and then depositing a metal film on the modified surface without intervening exposure to air. The level of ion bombardment used to so modify the surface of the substrate results from plasma conditions such that the expression $(q) \times (n_+) \times (\phi_f)/p$ has a value of at least about $5 \times 10^{17}$ eV/liter-atm; where $q$=the unit electronic charge (equal to 1 for units of eV/liter-atm);

$n_+$=the number density of positive ions in the plasma (liter$^{-1}$);

($\phi_f$)=the potential difference between the plasma and the polyimide surface (volts); and p=pressure in atmospheres.

Preferably, the level of ion bombardment at the surface of the substrate has a value of from about $5 \times 10^{17}$ eV/ liter-atm to about $25 \times 10^{17}$ eV/ liter-atm, more preferably from about $9 \times 10^{17}$ eV/ liter-atm to about $20 \times 10_{17}$ eV/ liter-atm. The level of ion bombardment at the surface is directly related to the number of ions generated in the plasma, the potential difference between the plasma and the polyimide, and the mean free path, which as used herein is the mean distance the ions travel between collisions with gas particles during their acceleration toward the polyimide substrate. Thus, the level of ion bombardment at the surface of the substrate can be increased by increasing the time of exposure to the ion bombardment and the power supplied to the plasma. The level of ion bombardment at the surface of the substrate can also be increased by decreasing the plasma gas pressure. Although the present method can employ any process which provides a sufficient level of ion bombardment at the surface of the substrate, it is preferred that the required ion bombardment be generated by a glow discharge process, more preferably a DC glow discharge process. It is also preferred that the metal film be deposited on the modified surface of the polyimide substrate by a vacuum metallization process.

In accordance with the preferred embodiment, a polyimide substrate is introduced into the chamber of a vacuum vessel which is then evacuated to between $1 \times 10^{-6}$ torr to $1 \times 10^{-4}$ torr. As used herein, polyimide refers to an aromatic polymer having imide groups, whether in the form of a pure polyimide or a copolymer of polyimide and another polymer or a blend of a polyimide and another polymer. Suitable polyimides include, for example, Kapton® films available from E.I. duPont de Nemours, Inc. and Upilex® films available from Ube, Ltd.

For convenience, the polyimide film is introduced either as a roll into a roll vacuum vessel or as a panel on an in-line system, both of which allow the polyimide substrate to be automatically advanced through the vessel. For convenience it is also preferred that the vacuum vessel have multiple, connected, chambers so that the polyimide substrate can be exposed to ion bombardment in one chamber and to vacuum metallization in a different chamber. If a single chamber is used the reactive plasma must first be removed from the chamber before metallization. Suitable multi-chambered vacuum vessels which are in the form of vacuum metallizers are available from Ulvac Corp., Balzers, and Leybold-Haraeus.

Once the appropriate vacuum level is reached a reactive gas such as oxygen, nitrogen, water vapor, preferably oxygen, is introduced into the chamber containing the polyimide substrate: The reactive gas is introduced into the chamber until the gas pressure reaches 0.01 to 0.25 torr, preferably 0.05 to 0.09 torr, more preferably about 0.07 torr. Once the appropriate gas pressure has been reached in the chamber, a power density of at least about 0.05 w/cm$^2$ is applied to the DC glow electrode to ionize the reactive gas atoms and reactive gas molecules in the chamber. The polyimide substrate is exposed to the resulting ions for about 5 to about 60 seconds, preferably for about 10 to about 25 seconds, to provide a substrate having reactive carboxylate groups on the surface thereof. The other operating conditions which are suitable for modifying the surface of the substrate such as for example gas flow rate, frequency, and excitation source are variable and dependent on the apparatus used to perform the treatment. Under the conditions of the present method, there is no deposition of a metal oxide layer on the surface of the polyimide substrate during the time the polyimide substrate is exposed to the reactive gas plasma.

Following ion bombardment in the plasma, the surface of the polyimide substrate is then metallized without first being exposed to air. Preferably, the metal film is deposited on the modified surface of the substrate by a vacuum metallization process. Although it is possible to use an evaporation process to form the metal film, it is preferred that a DC magnetron sputtering process be used. In the DC magnetron sputter process a cathode having a metal plate attached thereto, hereinafter referred to as a magnetron, is present in the vacuum metallization chamber. The process comprises the steps of introducing a working gas, preferably a noble gas, such as for example, argon, xenon, neon or krypton, into the vacuum metallization chamber, ionizing the gas so that the positively charged gas ions are attracted to the negatively charged magnetron where they impinge on the surface of the metal plate and cause the release of the metal atoms. The released metal atoms chemically bond to the reactive groups on the surface of the treated substrate. Preferably, the gas pressure in the vacuum metallization chamber is between 0.0005 torr to 0.01 torr. Preferably, the rate of metal deposition is between about 25 to about 500 anstroms per second, more preferably at about 100 Angstroms per second. Preferably, the temperature of the substrate is maintained at 0–100° C., more preferably between 25–50° C. throughout the deposition process. The metal film is deposited in a thickness sufficient to form a substantially continuous layer. Preferably, the thickness of the resulting metal film is between 100 Angstrom to 20,000 Angstroms, more preferably between 4000 and 5000 Angstroms. Once the metal film has been deposited on the surface of the polyimide substrate, the vacuum can be released and the metallized polyimide product exposed to ambient air.

The following examples of methods for attaching metal components to the surface of a polyimide substrate and methods of preparing a polyimide substrate for deposition of an adherent metal component thereon are for illustration only and are not intended to limit the scope of the invention as described in the appended claims.

EXAMPLE 1

Formation of Chromium-Coated Polyimide Products

A panel of the polyimide Kapton H, obtained from E.I. DuPont de Nemours, Inc, and having a thickness of 0.0002 inches was introduced into a first chamber of the Ulvac model SPW-30S vacuum metallizer that housed the DC glow discharge apparatus. The pressure in the chamber, which has a size of 360 liters, was decreased to a level of $2 \times 10^{-5}$ torr and then oxygen gas was introduced into the chamber to a pressure of 0.150 torr. Power was applied to the DC Glow electrode at a power density of 0.15 w/cm$^2$ to produce an oxygen plasma and to provide an ion bombardment on the surface of the polyimide substrate of $9.9 \times 10^{17}$ eV/liter-atm. The polyimide substrate was exposed to the DC oxygen glow discharge for about 10 seconds. Then the substrate was transferred to a second chamber. A layer of chromium was deposited on the modified surface of the substrate using a DC magnetron process which employed argon at a gas pressure of $2 \times 10^{-3}$ torr as the working gas and a power density of 2.4 w/cm$^2$ to generate the argon plasma. Chromium was deposited onto the modified surface of the substrate at a rate of 13.8 Angstroms/sec for 14.5 seconds to provide a polyimide substrate having a 200 Angstrom layer of chromium attached thereto. Then a layer of copper was deposited on the layer of chromium using a DC magnetron sputtering process which employed argon at a gas pressure of $2\times10^{-3}$ torr as the working gas and a power density of 4.2 w/cm² to generate the argon plasma. Copper was deposited onto the chromium layer at a rate of 50 Angstroms/sec for 60 seconds to provide a polyimide substrate having a 3000 Angstrom layer of copper on the chromium layer. Then a copper layer was electroplated on the copper layer to a final thickness of 7.6 micrometers and the final metal layer etched to provide lines having a width of 0.0014 inch.

The adhesion of the lines to the polyimide substrate was determined by a 90° peel test using an Instron tensile testor. The peel strength of the chromium-coated polyimide product was 26 g/mm.

(b) The surface of a Kapton H polyimide film, having a thickness of 0.002 inches, was exposed to ion bombardment using a DC glow discharge process as described above in example 1(a) except that an oxygen plasma pressure of 0.125 torr and a power density of 0.05 w/cm² was used. The degree of ion bombardment at the surface of the substrate was $12.6\times10^{17}$ eV/liter-atm. A 200 Angstrom layer of chromium and a 3000 Angstrom layer of copper were deposited on the surface of the substrate. Then a copper layer was electroplated onto the copper layer and the final metal layer etched as described in example 1(a) to provide lines having a width of 0.0014 inch. The adhesion of the liness to the substrate measured by peel strength testing as described above in example 1(a). The adhesion, in terms of peel strength, of the metal layer to the polyimide substrate was 26 g/mm.

(c) The surface of a Kapton H polyimide film, having a thickness of 0.002 inches was exposed to ion bombardment using a DC glow discharge process as described above in example 1(a) except that an oxygen plasma pressure 0.10 torr and a power density of 0.05 w/cm² was used. The degree of ion bombardment at the surface of the substrate was $11.4\times1$ eV/liter-atm. A 200 Angstrom layer of chromium and a 3000 Angstrom layer of copper were deposited on the surface of the substrate as described in example 1(a). Then a copper layer was electroplated onto the copper layer and the final metal layer etched as described in example 1(a) to provide lines having a width of 0.0014 inch. The adhesion, in terms of peel strength, of the metal layer to the polyimide substrate, determined as described above in example 1(a), was 31.5 g/mm.

(d) The surface of a Kapton H polyimide film, having a thickness of 0.002 inches, was exposed to ion bombardment using a DC glow discharge process as described above in example 1(a) except that an oxygen plasma pressure of 0.15 torr and a power density of 0.2 w/cm was used. The degree of ion bombardment at the surface of the substrate was $10.6\times10_{17}$ eV/liter-atm. A 200 Angstrom layer of chromium and a 3000 Angstrom layer of copper were deposited on the surface of the substrate as described above in example 1(a). Then a copper layer was electroplated onto the copper layer and the final metal layer etched as described in example 1(a) to provide lines having a width of 0.0014 inch. The adhesion of the metal layer to the polyimide substrate in terms of peel strength was 36 mm.

(e) The surface of a Kapton H polyimide film, having a thickness of 0.002 inches, was exposed to ion bombardment using a DC glow discharge process as described above in example 1(a) except that an oxygen plasma pressure of 0.150 torr and a power density of 0.25 w/cm² was used. The degree of ion bombardment at the surface of the substrate was $11.5\times10^{17}$ eV/liter-atm. A 200 Angstrom layer of chromium and a 3000 Angstrom layer of copper were deposited on the surface of the substrate as described above in example 1(a). Then a copper layer was electroplated onto the copper layer and the final metal layer etched as described in example 1(a) to provide lines having a width of 0.0014 inch. The adhesion of the metal layer to the polyimide substrate, in terms of peel strength, was 38 g/mm.

(f) The surface of a Kapton H polyimide film, having a thickness of 0.002 inches was exposed to ion bombardment using a DC glow discharge process as described above in example 1(a) except that an oxygen plasma pressure of 0.125 torr and a power density of 0.10 w/cm² was used. The degree of ion bombardment at the surface of the substrate was $14.1\times10^{17}$ eV/liter-atm. A 200 layer of chromium and a 3000 Angstrom layer of copper were deposited on the surface of the substrate as described in example 1(a). Then a copper layer was electroplated onto the copper layer and the final metal layer etched as described in example 1(a) to provide lines having a width of 0.0014 inch. The adhesion of the metal layer to the polyimide substrate, in terms of peel strength, was 29 g/mm.

(g) The surface of a Kapton H polyimide film, having a thickness of 0.002 inches, was exposed to ion bombardment using a DC glow discharge process as described above in example 1(a) except that an oxygen plasma pressure of 0.125 torr and a power density of 0.15 w/cm² was used. The degree of ion bombardment at the surface of the substrate was $15.5\times10^{17}$ eV/liter-atm. A 200 Angstrom layer of chromium and a 3000 Angstrom layer of copper were deposited on the surface of the substrate as described in example 1(a). Then a copper layer was electroplated onto the copper layer and the final metal layer etched as described in example 1(a) to provide lines having a width of 0.0014 inch. The adhesion of the metal layers to the polyimide substrate, in terms of peel strength, was 30 g/mm.

(h) The surface of a Kapton H polyimide film, having a thickness of 0.002 inches, was exposed to ion bombardment using a DC glow discharge process as described above in example 1(a) except that an oxygen plasma pressure of 0.125 torr and a power density of 0.20 w/cm² was used. The degree of ion bombardment at the surface of the substrate was $12.6\times10^{7}$ eV/liter-atm. A 200 Angstrom layer of chromium and a 3000 Angstrom layer of copper were deposited on the surface of the substrate as described in example 1(a). Then a copper layer was electroplated onto the copper layer and the final metal layer etched as described in example 1(a) to provide lines having a width of 0.0014 inch. The adhesion of the metal layer to the polyimide substrate, in terms of peel strength, was 40 g/mm.

(i) The surface of a Kapton H polyimide film, having a thickness of 0.002 inches, was exposed to ion bombardment using a DC glow discharge process as described above in example 1(a) except that an oxygen plasma pressure of 0.100 torr and a power density of 0.10 w/cm² was used. The degree of ion bombardment at the surface of the substrate was $16.6\times10_{17}$ eV/liter-atm. A 200 layer of chromium and a 3000 Angstrom layer of copper were deposited on the surface of the substrate as described in example 1(a). Then a copper layer was electroplated onto the copper layer and the final metal layer etched as described in example 1(a) to provide lines having a width of 0.0014 inch. The adhesion of the metal layers to the substrate, in terms of peel strength, was 34.5 g/mm.

(j) The surface of a Kapton H polyimide film, having a thickness of 0.002 inches, was exposed to ion bombardment using a DC glow discharge process as described above in example 1(a) except that an oxygen plasma pressure of 0.125 torr and a power density of 0.25 w/cm$^2$ was used. The degree of ion bombardment at the surface of the substrate was 15.2×10$^{17}$ eV/liter-atm. A 200 Angstrom layer of chromium and a 3000 Angstrom layer of copper were deposited on the surface of the substrate as described in example 1(a). Then a copper layer was electroplated onto the copper layer and the final metal layer etched as described in example 1(a) to provide lines having a width of 0.0014 inch. The adhesion of the metal layer to the polyimide substrate, in terms of peel strength, was 44 g/mm.

(k) The surface of a Kapton H polyimide film, having a thickness of 0.002 inches, was exposed to ion bombardment using a DC glow discharge process as described above in example 1(a) except that an oxygen plasma pressure of 0.100 torr and a power density of 0.25 w/cm$^2$ was used. The degree of ion bombardment at the surface of the substrate was 15×10$^{17}$ eV/liter-atm. A 200 Angstrom layer of chromium and a 3000 Angstrom layer of copper were deposited on the surface of the substrate as described in example 1(a). Then a copper layer was electroplated onto the copper layer and the final metal layer etched as described in example 1(a) to provide lines having a width of 0.0014 inch. The adhesion of the metal layers to the substrate, in terms of peel strength, was 48 g/mm.

(l) The surface of a Kapton H polyimide film, having a thickness of 0.002 inches, was exposed to ion bombardment using a DC glow discharge process as described above in example 1(a) except that an oxygen plasma pressure of 0.100 torr and a power density of 0.20 w/cm$^2$ was used. The degree of ion bombardment at the surface of the substrate was 17.0×10$^{17}$ eV/liter-atm. A 200 Angstrom layer of chromium and a 3000 Angstrom layer of copper were deposited on the surface of the substrate as described above in Example 1(a). Then a copper layer was electroplated onto the copper layer and the final metal layer etched as described in example 1(a) to provide lines having a width of 0.0014 inch. The adhesion of the metal layer to the polyimide substrate, in terms of peel strength, was 44 g/mm.

(m) The surface of a Kapton H polyimide film, having a thickness of 0.002 inches, was exposed to ion bombardment using a DC glow discharge process and coated with a 200 Angstrom layer of chromium and a 3000 Angstrom layer of copper as described above in example 1(a) except that an oxygen plasma pressure of 0.100 torr and a power density of 0.15 w/cm$^2$ was used. The degree of ion bombardment at the surface of the substrate was 17.9× 10$^{17}$ eV/liter-atm. Then a copper layer was electroplated onto the copper layer and the final metal layer etched as described in example 1(a) to provide lines having a width of 0.0014 inch. The adhesion of the metal layer to the polyimide substrate, in terms of peel strength was 35 g/mm.

(n) The surface of a Kapton H polyimide film, having a thickness of 0.002 inches was exposed to ion bombardment using a DC glow discharge process and coated with a 200 Angstrom layer of chromium and a 3000 Angstrom layer of copper as described above in example 1 except that an oxygen plasma pressure of 0.150 torr and a power density of 0.05 w/cm$^2$ was used. The degree of ion bombardment at the surface of the substrate was 6.5×10$^{17}$ eV/liter-atm. Then a copper layer was electroplated onto the copper layer and the final metal layer etched as described in example 1(a) to provide lines having a width of 0.0014 inch. The adhesion of the metal layer to the polyimide substrate, in terms of peel strength, was 16 g/mm.

(o) The surface of a Kapton H polyimide film, having a thickness of 0.002 inches was exposed to ion bombardment using a DC glow discharge process and coated with a 200 Angstrom layer of chromium and a 3000 Angstrom layer of copper as described above in example 1(a) except that an oxygen plasma pressure of 0.100 torr and a power density of 0.10 w/cm$^2$ was used. The degree of ion bombardment at the surface of the substrate was 8.6×10$^{17}$ eV/liter-atm. Then a copper layer was electroplated onto the copper layer and the final metal layer etched as described in example 1(a) to provide lines having a width of 0.0014 inch. The adhesion of the metal layer to the polyimide substrate, in terms of peel strength, was 16.5 g/mm.

The adhesion of the copper/chromium layer to the polyimide layer of each of the chromium-coated products of examples 1(a) through 1(o) were compared to a adhesion of a chromium-coated polyimide product in which a 200 Angstrom layer of chromium and a 3000. Angstrom layer of copper had been deposited on the surface of the product's substrate without prior exposure to ion bombardment. The peel strength of this control product was 22 g/mmn, a value which is depicted in FIG. 1 as a horizontal line. As shown in FIG. 1, which plots the peel strength, in g/mm, of the chromium-coated polyimide products of examples 1(a) to 1(o) vs degree of ion bombardment, a marked improvement in adhesion between the chromium layer and polyimide substrate was observed when the level of ion bombardment reached a value of approximately 9×10$^{17}$ eV/liter-atm. When the polyimide substrate was exposed to an oxygen plasma having a level of ion bombardment greater than this value, the peel strength continued to increase. These results indicate that the adherence of a chromium film to a polyimide substrate is enhanced when level of ion bombardment attains a threshold value. It is believed that the reduced adhesion between the chromium layer and the polyimide substrate that occurs below this value is due to the formation of a boundary layer of fragments of degraded polyimide which interferes with adhesion of the chromium film to the surface of the substrate. It is also believed that at ion bombardment levels at or above this value, the polyimide polymer becomes crosslinked. These results also indicate that ion bombardment levels below this value are useful for attaching chromium to polyimide substrates. However, in cases where enhanced adhesion of the chromium layer to the polyimide substrate is desired, it is preferred that the substrate be exposed to ion bombardment levels at or above the threshold value.

EXAMPLE 2

Formation of Copper-Coated Polyimide Products

The surface of a Kapton E polyimide film, having a thickness of 0.002 inches was exposed to ion bombardment using a DC glow discharge process as described above in example 1(a) except that an oxygen plasma pressure of 0.070 torr and a power density of 0.22 w/cm$^2$ was used. The calculated degree of ion bombardment at the surface of the substrate was about 17×10$^{17}$ eV/liter-atm. Following ion bombardment in the first chamber, the substrate was transferred to a second chamber where a copper layer was deposited onto the modified surface of the substrate using a DC magnetron process which employed argon at a gas pressure of 2×10$^{13}$ torr as the working gas and a power density of 8.2 w/cm$^2$ to generate the argon plasma. Copper was deposited onto the modified surface of the substrate at a rate of 100 Angstroms/sec for 60 seconds to provide a layer of copper having a thickness of 6000 Angstroms bonded to the surface of the substrate. Then a copper layer was electroplated onto the copper layer and the final metal layer etched as described in example 1(a) to provide lines having a width of 0.0014 inch. The adhesion of the copper layer to the polyimide substrate, in terms of peel strength, was 110 g/mm.

The copper-coated polyimide products were subjected to exposure at 85° C. and 80% relative humidity for 1100 hours and the adhesion of the etched lines to the polyimide substrate determined by a 90° peel test on an Instron tensile tester. The peel strength prior to exposure to the high temperature/high humidity environment was 110 g/mm. At the end of the 1100 hour exposure the peel strength was 85 g/mm. For comparison, polyimide films having a chromium tie coat disposed between the copper layer and the surface of the polyimide substrate exposed to the same degree of ion bombardment were also subjected to a high temperature/high humidity environment. These products had a peel strength of 90 g/mm prior to exposure to the environment and a peel strength of 61 g/mm after a 1000 hour exposure to 85° C. and 80% relative humidity. These results demonstrate that copper-coated polyimide products prepared in accordance with the present invention have adhesive properties comparable to products that use a tie coat to enhance adhesion between the copper components and the polyimide substrate. Thus, the present method is useful for directly attaching copper components to a polyimide substrate, i.e. attaching copper components to the polyimide substrate without using a polymeric adhesive or a tie coat.

EXAMPLE 3

Chemically-Modified Polyimide Substrates

Kapton E polyimide film, having a thickness of 0.002 inches was exposed to ion bombardment using a DC glow discharge process as described above in example 2. The calculated degree of ion bombardment at the surface of the substrate was about $17 \times 10^{17}$ eV/liter-atm.

The surface of the oxygen ion-bombarded polyimide substrate was visually examined by scanning electron microscopy (SEM) at a magnification of 5000×. The visual examination indicated that the surface of the polyimide substrate was as smooth as a polyimide substrate that had not been subjected to the DC oxygen glow discharge process. Previous studies have shown that polyimide substrates that are etched using an oxygen ion beam have a very rough surface. (See. e.g., Ruoff, A. L. et al. IBM J. Res. Develop. 32(5), 626 (1988)). These results indicate that polyimide substrates treated in accordance with the present method are substantially smooth, i.e., do not have a roughened surface.

The surface of the oxygen ion-bombarded polyimide substrate was also examined by ESCA. This analysis indicated that exposure of a polyimide substrate to an ion bombardment of about $17 \times 10^{17}$ eV/liter-atm resulted in formation of carbonyl and reactive carboxylate groups on the surface of the ion-bombarded substrate.

Thus, the present method of attaching a metal component to a polyimide substrate provides a copper-coated polyimide product having a peel strength comparable to or greater than that of a copper-coated polyimide product having a chromium tie coat between the copper layer and polyimide substrate. The present method also provides a copper-coated polyimide product in which the plasma-treated surface of the polyimide substrate is substantially smooth, i.e., is not roughened or etched, as determined by SEM at 5000×. The present method also provides a copper-coated polyimide product in which a portion of the copper atoms of the copper layer are chemically bonded to the reactive groups at the interface between the copper layer and the polyimide substrate.

While the invention has been described to some degree of particularity, various adaptations and modifications can be made without departing from the scope of the invention as defined in the appended claims.

What is claimed is:

1. A method of depositing an adherent metal film to at least one surface of a polyimide substrate comprising the steps of:

(a) exposing at least one surface of the polyimide substrate to a reactive gas plasma that results in carboxyl or carboxylate group formation, and that provides a level of ion bombardment of at least about $9 \times 10^{17}$ eV/liter-atm, wherein the level of ion bombardment is represented by the equation: $(q) \times (n_+) \times (\emptyset_f)/p$; where q=the unit electronic charge (equal to 1 for units of e/V/liter-atm);

$n_+$=the number density of positive ions in the plasma (liter$^{-1}$);

$(\emptyset_f)$=the potential difference between the plasma and the polyimide surface (volts); and p=pressure in atmospheres; and (b) then depositing a metallic film onto the ion-bombarded surface without intervening exposure to air.

2. The method of claim 1 wherein the plasma provides a level of ion bombardment in the range of from about $9 \times 10^{17}$ eV/liter-atm to about $25 \times 10^{17}$ eV/liter-atm.

3. The method of claim 1 wherein the ions are generated by a glow discharge process and wherein the metal film is deposited on the ion-bombarded surface by a vacuum metallization process.

4. The method of claim 1 wherein said deposited metallic film is a copper film.

5. The method of claim 4 wherein the ions are generated by a DC glow discharge process; and wherein said copper film is deposited on the ion-bombarded surface by a vacuum metallization process.

6. The method of claim 5 wherein the reactive gas plasma is an oxygen plasma having a pressure of between 0.01 and 0.30 torr; and wherein the substrate is bombarded with oxygen ions formed by subjecting the oxygen to a power density of from about 0.05 to about 0.5 w/cm$^2$.

7. The method of claim 1 wherein said metallic film is a chromium film; and wherein said chromium film is deposited on the ion-bombarded surface by a vacuum metallization process.

8. A method of depositing a copper film on a surface of a polyimide substrate comprising the steps of:

(a) exposing the polyimide substrate to an oxygen plasma comprising oxygen ions that provide a level of ion bombardment of at least about $9 \times 10^{17}$ eV/liter-atm, wherein the level of ion bombardment is represented by the equation: $(q) \times (n_+) \times (\emptyset_f)/p$; where q=the unit electronic charge (equal to 1 for units of e/V/liter-atm);

$n_+$=the number density of positive ions in the plasma (liter$^{-1}$);

($\phi_f$)=the potential difference between the plasma and the polyimide surface (volts); and p=pressure in atmospheres; and (b) then depositing a copper film onto the surface without intervening exposure to air.

9. The method of claim 8 wherein the ions are generated by a flow discharge process and wherein the copper film is deposited on the ion-bombarded surface by a vacuum metallization process.

10. The method of claim 9 wherein the ions are generated by a DC glow discharge process.

11. The method of claim 9 wherein the reactive plasma comprises oxygen ions.

12. The method of claim 11 wherein the reactive plasma has a pressure of between about 0.01 and 0.30 torr;

wherein the substance is bombarded with said oxygen ions that have been formed by subjecting oxygen gas to a power density of at least about 0.05 w/cm$^2$; and wherein the substrate is exposed to the reactive gas plasma for at least 5 seconds.

13. The method of claim 12 wherein the plasma pressure is between about 0.05 and 0.0.09 torr.

14. The method of claim 12 wherein the power density is from about 0.05 w/cm$^2$.

15. The method of claim 12 wherein the substrate is exposed to the reactive gas plasma for about 5 to about 60 seconds.

* * * * *